United States Patent [19]

Lee et al.

[11] Patent Number: 4,797,856
[45] Date of Patent: Jan. 10, 1989

[54] SELF-LIMITING ERASE SCHEME FOR EEPROM

[75] Inventors: Winston K. M. Lee, San Francisco; Duane H. Oto, Santa Clara; Simon M. Tam, San Mateo, all of Calif.

[73] Assignee: Intel Corporation, Santa Clara, Calif.

[21] Appl. No.: 39,086

[22] Filed: Apr. 16, 1987

[51] Int. Cl.$^4$ .................. G11C 7/00; G11C 11/40
[52] U.S. Cl. .................. 365/185; 365/189; 365/218
[58] Field of Search .................. 365/185, 218, 189

[56] References Cited

U.S. PATENT DOCUMENTS

| | | | |
|---|---|---|---|
| 4,228,527 | 10/1980 | Gerber et al. | 365/218 X |
| 4,437,174 | 3/1984 | Masuoka | 365/218 |
| 4,628,487 | 12/1986 | Smayling | 365/185 |
| 4,677,590 | 6/1987 | Arakawa | 365/185 |

FOREIGN PATENT DOCUMENTS

| | | |
|---|---|---|
| 54-69037 | 2/1979 | Japan . |
| 56-47992 | 4/1981 | Japan . |
| 2029154 | 8/1978 | United Kingdom . |
| 2028615 | 6/1979 | United Kingdom . |

*Primary Examiner*—Stuart N. Hecker
*Assistant Examiner*—Alyssa H. Bowler
*Attorney, Agent, or Firm*—Blakely, Sokoloff, Taylor & Zafman

[57] ABSTRACT

A self-limiting scheme to prevent an over-erase condition of a one-transistor EEPROM cell. During an erase cycle, a drain voltage is fed back to a floating gate to counteract a positive erase voltage on the source of the memory cell and therein reduce the electric field across the tunnel oxide leading to the cessation of erase. In another scheme, the drain voltage is fed back to deactivate the erase voltage when a predetermined drain voltage value is exceeded.

14 Claims, 2 Drawing Sheets

SELF-LIMITING ERASE SCHEME FOR EEPROM

BACKGROUND OF THE INVENTION

1. Field of the Invention.

The present invention relates to the field of electrically programmable and electrically erasable memory cells and more particularly the erase of memory cells employing floating gates.

2. Prior Art.

The fabrication of electrically programmable read-only memories (EPROMs) utilizing metal-oxide-semiconductor (MOS) techology is well-known in the prior art. These EPROMs employ memory cells utilizing floating gates which are generally formed from polysilicon members completely surrounded by an insulator. Electrical charge is transferred into the floating gate using a variety of techniques such as avalanche injection, channel injection, Fowler-Nordheim tunnelling, channel hot electron injection, etc. A variety of phenomena have been used to remove charge from the floating gate including exposing the memory to ultraviolet radiation. The floating gate is programmed when a charge is stored in the floating gate. The cell is in an unprogrammed, or erased, state when the floating gate is discharged.

Because of complex and time consuming procedures required to erase EPROMs, these devices have been used primarily in applications requiring read-only memories. Electrically programmable and electrically erasable read-only memories (EEPROMs) were developed to provide the capability of electrically erasing programmed memory cells. These EEPROMs have also been referred to as electrically alterable read-mostly memories. Commercially available EEPROMs have generally used a thin oxide region to a transfer the charge into and from a floating gate. In a typical memory, a two-transistor cell is used. For instance, U.S. Pat. No. 4,203,158 discloses the fabrication of such an EEPROM cell. Further, U.S. Pat. No. 4,266,283 discloses the arrangement of EEPROMs into an array wherein X and Y select lines provide for the selection, programming and reading of various EEPROM cells. These EEPROM cells do not lend themselves to being reduced in substrate area as due the EPROM cells.

Various techniques have been implemented to reduce the size of the memory array by providing higher density cells. One such technique is disclosed in U.S. Pat. No. 4,432,075. Further, the use of a single 5 volt potential supply to provide the requisite current and voltage for the proper operation of EEPROMs is crucial to the manufacture of the more recent EEPROM technology. U.S. Pat. No. 4,432,075 discloses the sharing of a single source of hot electrons by a number of cells to provide the additional current required for programming the various cells. Further, the use of a single 5 volt external supply to generate on-chip a higher potential which is required for programming is known in the prior art.

A further attempt to provide higher density, low voltage EEPROM cell is disclosed in a U.S. patent application, Ser. No. 892,446 filed Aug. 4, 1986 and entitled Low Voltage EEPROM Cell and is assigned to the assignee of the present application. In this copending application, a one-transistor EEPROM cell which uses channel injection for charging the floating gate and tunnelling for discharging the gate is disclosed. A single 5 volt potential is used with a higher programming/erasing potential of approximately 11–15 volts being generated on-chip. However, the EEPROM of the one-transistor design uses the same transistor and the same oxide separating the transistor elements from the floating gate to both program and erase the floating gate. Because of the one-transistor design, over-erased condition of a memory cell is more prevalent than in the two-transistor design. An over-erase condition must be avoided in order to prevent the one-transistor EEPROM memory cell from becoming a depletion-like transistor in the read mode. During the read mode an over-erased memory cell will disable a whole column of a memory array if the memory cells are structured as an array. The over-erase problem is not typically a concern with the two-transistor design or the quasi-one-transistor EEPROM design, which is disclosed in a copending patent application, Ser. No. 009,998 filed Feb. 2, 1987 which is also assigned to the assignee of the present invention. However, again, the two-transistor design will required much bigger cell area while the quasi-one-transistor EEPROM described in the Ser. No. 009,998 reference requires more processing steps.

The present invention provides for a scheme to self-limit the electrical erase of a single transistor floating gate EEPROM cell, wherein whole arrays are not disabled due to an over-erase condition of a single EEPROM cell.

SUMMARY OF THE INVENTION

The present invention describes an apparatus and a method for self-limiting electrical erase of one-transistor floating gate EEPROM cells. In one scheme, drain voltage is fed back to the control gate of an EEPROM cell. When an erasing potential is placed on the source of the cell, electrons discharge to the source by tunnelling and cause the floating gate to become more positive. This increase in the positive potential is reflected at the drain, which voltage is a cell threshold below the floating gate voltage. Because of the drain-to-gate feedback, the control gate also becomes more positive and couples the floating gate positively as well. The floating gate potential increase will decrease the potential and electric field across the tunnel oxide, wherein accelerating the termination of erase to prevent an over-erase condition.

In an alternative scheme, the control gate is grounded and the drain potential controls the deactivation of the erase voltage. After the erasing sequence commences, electrons are discharged from the floating gate until the drain reaches a predetermined potential. At this point, a signal is sent to deenergize the erase voltage.

In one circuit implementation an amplifier is used to set the gain of the feedback voltage in the first scheme. In the alternative scheme, a comparator is used to compare the drain potential to a presettable voltage reference, such that the output of the comparator changes states to initiate the deactivation of the erase voltage when the drain potential exceeds the voltage reference.

DETAILED DESCRIPTION OF THE PRESENT INVENTION

An apparatus and a method for self-limiting the electrical erase of a one-transistor floating gate EEPROM cell is described. In the following description, numerous specific details are set forth, such as specific circuit configuration, components, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

Figure 1:
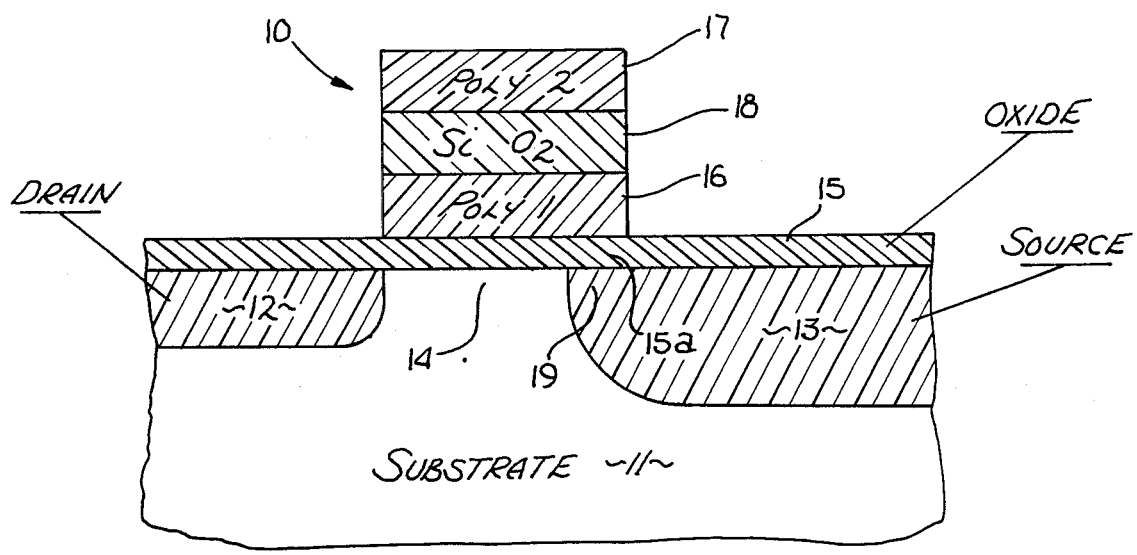
FIG. 1 is a cross-sectional elevation view of an embodiment of one-transistor EEPROM cell.

Referring to FIG. 1, a one-transistor EEPROM cell 10 is shown. The formation of EEPROM 10 is described in a copending application, Ser. No. 892,446, filed Aug. 4, 1986, and assigned to the assignee of the present application. The one-transistor EEPROM cell 10 is comprised of a substrate 11, drain 12, source 13, and a channel region 14 separating drain 12 and source 13. An oxide layer 15 is formed above the channel region 14, wherein floating gate 16 and control gate 17 are formed above region 14. Floating gate 16 is comprised of a first polysilicon layer. A second polysilicon layer which comprises the control gate 17 is separated by a silicon oxide ($SiO_2$) layer 18 which operates as a dielectric medium separating the two polysilicon layers 16 and 17. As described in the copending application, EEPROM cell 10 uses channel injection to inject electrons from channel region 14 into floating gate 16. The one-transistor EEPROM cell 10 also utilizes Fowler-Nordheim tunnelling for discharging the floating gate 16 to erase the memory cell by causing electrons to tunnel across thin gate dielectric layer 15. As explained in the copending application, the erase sequence is achieved because source 13 extends under a portion of floating gate 16, such that electrons from floating gate 16 are able to tunnel across oxide layer 15 into region 19 underlying floating gate 16.

During an erasing sequence, a high voltage (10 volts to 15 volts) is applied to source 13 of EEPROM cell 10. Due to capacitive coupling, a potential will be established across gate tunnel dielectric 15a between the floating gate 16 and source overlap region 19. Under a normal erasing operation, control gate 17 is at 0 volts and rain 12 is left floating. A potential of approximately 12 volts is placed on source 13. As the EEPROM cell 10 is being erased, electrons are removed from floating gate 16 and gate 16 potential increases positively. Because drain 12 is open, the potential of drain 12 will increase also and eventually will result in a voltage difference between floating gate 16 and drain 12, such that potential at drain 12 is lower than the potential at gate 16 by the threshold voltage of the MOS transistor.

If the erasing sequence continues, electrons will continue to tunnel from floating gate 16 into overlap region 19, resulting in a net positive potential of the floating gate. An over-erase condition occurs when as a result of erase, the floating gate potential is sufficiently high, such that during a read condition the unselected cell conducts current. Typical voltages for an unselected cell are 0 volts on the control gate, 0 volts at the source and approximately 1.5 volts at the drain. Whereas, during a read condition, unprogrammed (erased) EEPROM cells should only conduct when that cell is selected by having a voltage, typically 5 volts, applied to control gate 17, an over-erased cell 10 will conduct even when it is not selected (0 volts on control gate 17), thereby providing an erroneous reading. If cell 10 is part of a memory array, cell 10 can provide an erroneous reading on its corresponding matrix output line.

This over-erase problem can be eliminated with a two-transistor design or the quasi-one-transistor EEPROM design as described in the earlier mentioned references. However, as previously stated, the two-transistor design will require much bigger cell area while the quasi-one-transistor EEPROM requires more processing steps.

Figure 2:
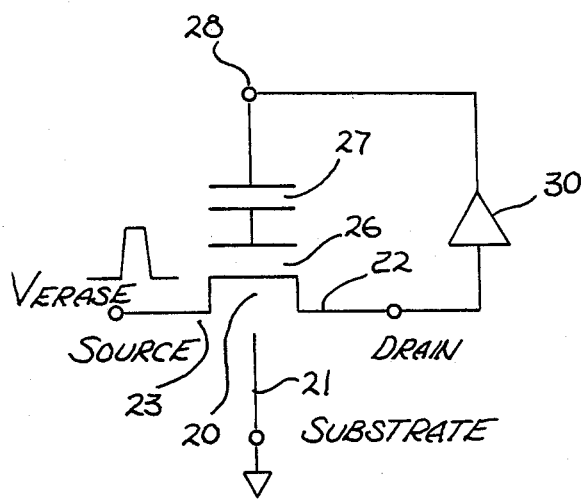
FIG. 2 illustrates a scheme of providing self-limiting electrical erase by providing a feedback signal to a control gate of a one-transistor EEPROM cell.

Referring to FIG. 2, it illustrates a scheme of the present invention for providing a self-limiting erase implementation. An EEPROM cell 20, equivalent to EEPROM cell 10 of FIG. 1, is shown having substrate 21, drain 22, source 23, floating gate 26 and control gate 27. During an erase condition, substrate 21 is grounded and an erasing potential ($V_{ERASE}$) is impressed on source 23. An amplifier 30 is coupled between drain 22 and gate terminal 28 of control gate 27. Amplifier 23 basically provides feedback between drain 22 and control gate 27.

In this configuration, control gate 27 is no longer set to 0 volts, but is connected to drain 22 through the feedback amplifier 30, such that during an erasing condition the potential on drain 22 is fed back to control gate 27. As $V_{ERASE}$ is imposed on source 23, electrons tunnel from floating gate 26 into source 23. As electrons leave floating gate 26, the potential on the drain will increase proportionately. However, now that the drain is coupled to gate 27, the increase in the potential of drain 22 is also felt at terminal 28. Therefore, as the drain potential increases, potential at terminal 28 increases accordingly. Due to the control gate 27 to floating gate 26 capacitive coupling, the potential at control gate 27 is coupled to floating gate 26. As drain potential increases positively, the feedback provided at terminal 28 causes the potential at floating gate 26 to increase accordingly in a positive direction. Therefore, as more electrons leave gate 26, the feedback voltage increases and provides a more positive voltage on control gate 27 to counter $V_{ERASE}$.

Because of the strong relationship between the Fowler-Nordheim tunnelling current and voltage, the tunnel erase current will decrase due to the positive voltage coupled back to floating gate 26 and eventually stopping the tunnelling process. By carefully adjusting the gain of amplifier 30, a proper feedback voltage will be impressed on terminal 28 as drain 22 increases in potential during erase. The positive voltage on control gate 27 will be coupled through to floating gate 26, thereby increasing the positive voltage potential at floating gate 26. As the floating gate 26 voltage increases, the tunnelling process will decrease and eventually stop prior to putting the cell into an over-erase condition. By properly adjusting the gain of amplifier 30, the tunnelling sequence can be made to terminate prior to cell 20 entering an over-erase condition. Once the erase threshold has been reached, a continued application of $V_{ERASE}$ will have no effect on the erasing of cell 20. Although drain 20 can be coupled directly to gate 28 without the use of amplifier 30, a more precise adjustment of the feedback voltage can be achieved by using an amplifier having a presettable gain. A buffer and amplifier combination will also function equivalently. The ability to adjust the amount of feedback will result in the ability to control the final floating gate potential.

Figure 3:
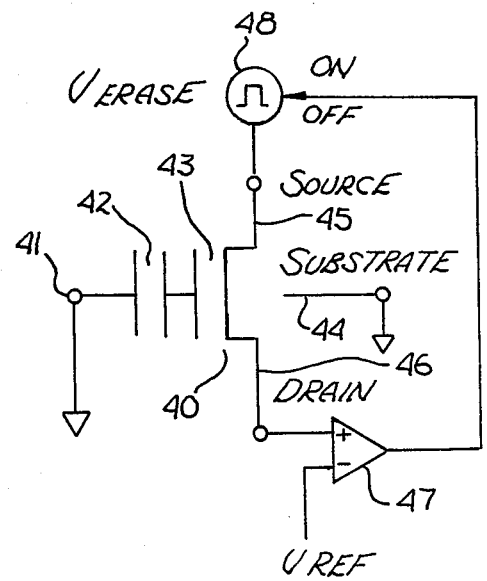
FIG. 3 illustrates an alternative scheme wherein a feedback signal is used to control an erase voltage present on a source region of a one-transistor EEPROM cell.

Referring to FIG. 3, it illustrates an alternative feedback scheme for an EEPROM cell 40, which is equivalent to the EEPROM cell 10 of FIG. 1. In this scheme, terminal 41 of control gate 42 is coupled to ground, thereby placing a ground potential on control gate 42. Substrate 44 is also grounded. An erase voltage supply 48 is coupled to source 45. Drain 46 is coupled to one input terminal of comparator 47 and the other input terminal of comparator 47 is coupled to a reference voltage, $V_{REF}$. The output of the comparator is coupled back to control $V_{ERASE}$ supply 48. Comparator 47 provides a feedback signal to turn off $V_{ERASE}$ supply 48.

In this embodiment, erase potential $V_{ERASE}$ is applied to source 45 by turning on supply 48. As cell 40 undergoes an erasing sequence by electron tunnelling from floating gate 43 to source 45, the potential on drain 46 increases proportionately. The output of comparator 47 is configured to provide a control signal which permits supply 48 to activate $V_{ERASE}$ to be impressed on source 45. However, as drain potential increases during the erasing sequence, drain potential will eventually surpass that of the reference voltage $V_{REF}$, causing the output of comparator 47 to change states and shutting off $V_{ERASE}$ supply 48. By presetting the value of $V_{REF}$, comparator 47 can be made to shut off $V_{ERASE}$ supply 48 when drain 46 potential reaches a predetermined point where erasing is completed. Therefore, comparator 47 controls to deactivate $V_{ERASE}$ supply 48, so that floating gate 43 will not continue to release electrons resulting in an over-erase condition of cell 40.

Figure 4:
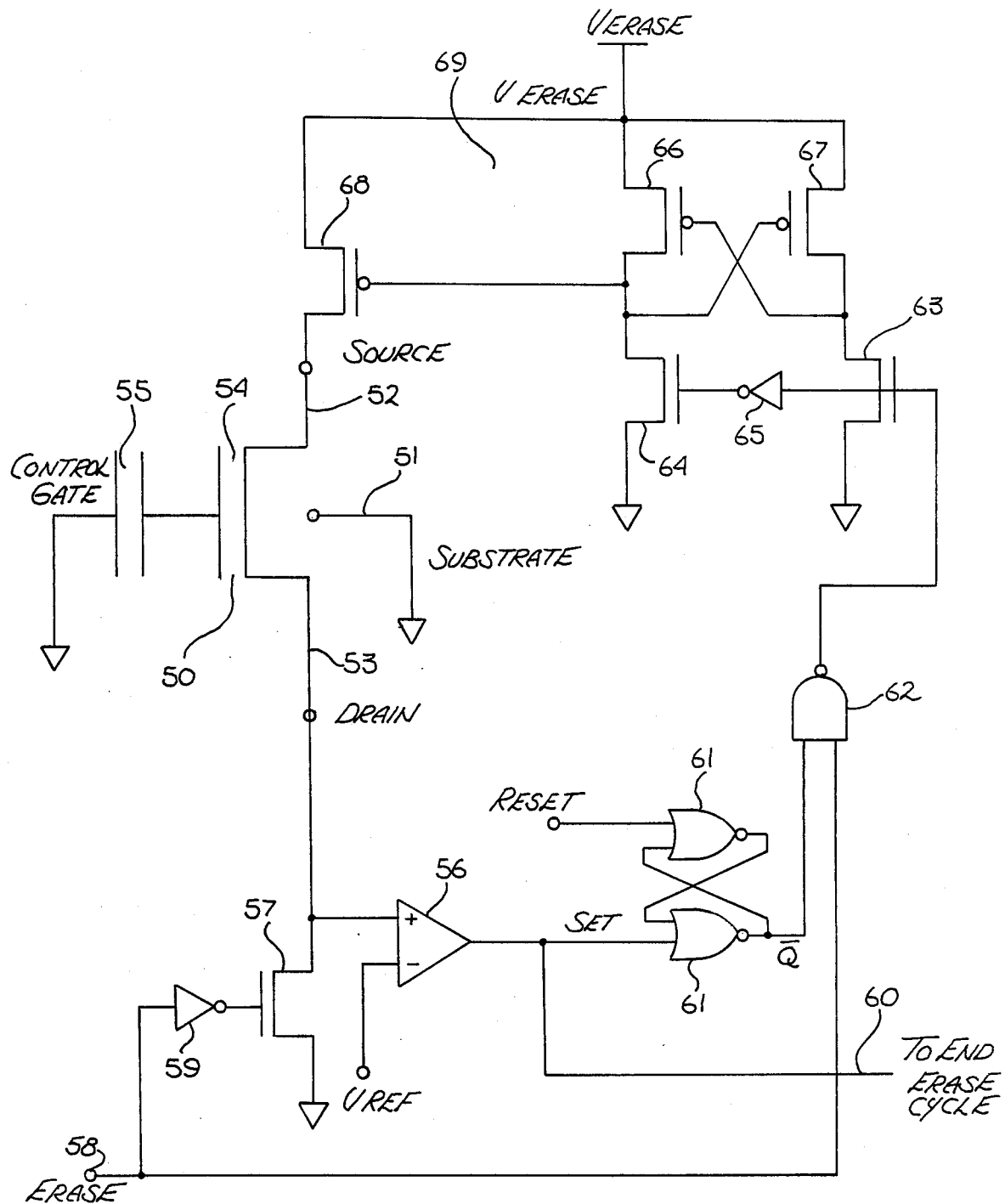
FIG. 4 illustrates a circuit implementation for the feedback to source scheme of FIG. 3.

Referring to FIG. 4, it shows a more detailed circuit implementation of the feedback to source scheme illustrated in FIG. 3. An EEPROM cell 50 having a substrate 51, source 52, drain 53, floating gate 54, control gate 55, is shown. Cell 50 is equivalent to the EEPROM cell 10 of FIG. 1 and is configured to have a ground coupled to control gate 55, and was the case in FIG. 3. Drain 53 of EEPROM 50 is coupled to the positive input terminal of comparator 56 as well as to one terminal of transistor 57. The other side of transistor 57 is coupled to ground. The negative terminal of comparator 56 is coupled to reference voltage, $V_{REF}$. Terminal 58 is coupled to the gate of transistor 57 through inverter 59. Terminal 58 receives an erase signal from control source (not shown) for activating an erase sequence of cell 50.

The output of comparator 56 is coupled to line 60 for providing a signal to deactivate the erase signal on terminal 58. The output of comparator 56 is also coupled to provide a set signal to RS flip-flop pair 61. A reset signal is also coupled to the RS flip-flop 61. The output of the RS flip-flop pair 61 is coupled as one input to NAND gate 62 and a second input of NAND gate 62 is coupled to terminal 58. The output of NAND gate 62 is coupled to the gate of transistor 63 and to the gate of transistor 64 through inverter 65. The drain of transistor 63 is coupled to the gate of transistor 66 and the drain of transistor 64 is coupled to the gate of transistor 67 such that transistors 63 and 66 conduct together when transistors 64 and 67 are off, and vice-versa. The drains of transistor 66 and 67 are coupled to a supply $V_{ERASE}$, as well as to one input of transistor 68. The other terminal of transistor 68 is coupled to source 52. Drain of transistor 64 is coupled to gate of transistor 68 such that circuit 69, comprised of components 63-68, provides the control for placing $V_{ERASE}$ on source 52.

The erase command signal at terminal 58 going high will initiate an erase cycle by turning off transistor 57 and causing drain 53 to go into a float condition. At this point $V_{REF}$ has a higher magnitude potential than that of drain 53 causing the output of comparator 56 to be low. The output from SR flip-flop 61 is high, due to a reset signal resetting flip-flops 61 prior to presenting the erase signal on terminal 58. The reset signal originates from a control source (not shown). The output of NAND gate 62 goes low and, due to inverter 65, activates transistors 64 and 67. Activating transistor 64 turns on transistor 68. Transistor 68 functions as a switch and when turned on places $V_{ERASE}$ on source 52.

As the cell 50 continues to erase, the floating gate 54 potential increases positively and the drain node potential of drain 53 increase as a result of cell sub-threshold conduction charging this node. When the drain node voltage of drain 53 exceeds the reference voltage $V_{REF}$ the output of comparator 56 goes high to set the ouput of latch 61 low and results in a high output from NAND gate 62. Transistors 64 and 67 are turned off as transistors 63 and 66 are turned on. Due to a high state of the gate of transistor 68, transistor 68 is turned off removing $V_{ERASE}$ from source 52.

Using this feedback scheme the electron discharge level of floating gate 54 can be adjusted to a predetermined desired level by adjusting the reference voltage $V_{REF}$. The output of comparator 56 is fedback on line 60 to turn off the erase signal on terminal 58 and activating transistor 57 to place a ground on drain 53. The erase cycle is completed.

Although a particular circuit implementation is shown, it is appreciated that various other circuits can be used without departing from the spirit and scope of the invention.

Thus, a self-limiting erase scheme for EEPROMs has been discribed.

We claim:

1. An apparatus for self-limiting an electrical erase of a floating gate electrically programmable and electrically erasable read-only memory (EEPROM) cell having first and second doped regions separated by a channel region, and having a floating gate and a control gate overlying said channel region and a portion of said first doped region, comprising:

voltage supply means coupled to said first doped region to provide an erase voltage for discharging electrons from said floating gate to said first doped region;

feedback means coupled to said second region for providing a feedback signal to limit said discharging;

wherein as said floating gate discharges electrons to said first doped region, said second doped region increases in potential and said feedback means uses said potential to provide said feedback signal such that an erasing cycle is terminated prior to over-erasing said EEPROM cell.

2. The apparatus as defined in claim 1, wherein said feedback means is coupled to said second doped region and to said control gate for providing a feedback voltage proportional to said potential of said second doped region, such that as said electrons discharge from said floating gate, said feedback voltage increases proportionately to provide a counteracting potential on said control gate to inhibit said discharging.

3. The apparatus as defined in claim 2, wherein said feedback means is comprised of an amplifier having a predetermined gain.

4. The apparatus as defined in claim 3, wherein said voltage supply means provides a positive erase voltage.

5. The apparatus as defined in claim 4, wherein said feedback means further includes a buffer coupled to said amplifier.

6. The apparatus of claim 5, wherein said first doped region is a source region and said second doped region is a drain region.

7. The apparatus as defined in claim 1 is further comprised of switching means coupled to said feedback means and to said voltage supply means for deactivating said voltage supply means when said potential exceeds a predetermined value.

8. The apparatus as defined in claim 7, wherein said feedback means monitors a potential of said second doped region, such that as said electrons discharge from said floating gate, said potential of said second doped region increases proportionately and said feedback signal turns off said voltage supply means.

9. The apparatus as defined in claim 8, wherein said feedback means further includes a comparator for comparing said potential of said second doped region to a reference source, such that said comparator generates said feedback signal to turn off said voltage supply means when said potential exceeds said reference source.

10. The apparatus as defined in claim 9, wherein said voltage supply means provides a positive erase voltage.

11. The apparatus of claim 10, wherein said first doped region is a source region and said second doped region is a drain region.

12. A method for self-limiting an electrical erase of an electrically programmable and electrically erasable read-only memory (EEPROM) cell having a source, drain, floating gate and control gate, wherein said source and drain are separated by a channel region, and said floating gate and control gate overlying sad channel region and a portion of said source region, comprising the steps of:
    providing an erasing potential on said source to cause electrons to tunnel from said floating gate to said source;
    coupling a potential of said drain as feedback to said control gate, such that as said floating gate is discharged of said electrons, said drain potential increases proportionately to said discharge and said feedbback also causes a proportionate increase in potential at said control gate to counteract said erasing potential;
    wherein electron discharge is inhibited to prevent over-erasing of said EEPROM cell.

13. A method for self-limiting an electrical erase of an electrically programmable and electrically erasable read-only memory (EEPROM) cell having a source, drain, floating gate and control gate, wherein said source and drain are separated by a channel region, and said floating gate and control gate overlying said channel region and a portion of said source region, comprising the steps of:
    providing an erasing potential on said source to cause electrons to tunnel from said floating gate to said source;
    monitoring a potential of said drain, wherein as said electrons discharge from said floating gate, said drain potential increases proportionately;
    comparing said drain potential to a predetermined reference value;
    deactivating said erasing potential when said drain potential exceeds said predetermined reference value;
    wherein electron discharge is terminated to prevent over-erasing of said EEPROM cell.

14. The method as defined in claim 13 further comprising the step of grounding said control gate prior to providing said erasing potential.

* * * * *